United States Patent [19]

Duchane et al.

[11] Patent Number: 4,481,999
[45] Date of Patent: Nov. 13, 1984

[54] METHOD OF FORMING A THIN UNBACKED METAL FOIL

[75] Inventors: David V. Duchane, Los Alamos; Barry L. Barthell, Tesuque, both of N. Mex.

[73] Assignee: The United States of America as represented by the United States Department of Energy, Washington, D.C.

[21] Appl. No.: 351,378

[22] Filed: Feb. 23, 1982

[51] Int. Cl.³ .................. B22C 7/02; B22C 9/24; B22D 23/00; B22D 29/00

[52] U.S. Cl. .......................... 164/6; 164/36; 164/44; 164/45; 164/46; 164/131; 164/138

[58] Field of Search .................. 164/6, 14, 15, 23, 33, 164/44, 45, 46, 47, 72, 74, 131, 132, 138, 36

[56] References Cited

U.S. PATENT DOCUMENTS

| | | | |
|---|---|---|---|
| 1,447,683 | 3/1923 | Morris | 164/178 |
| 1,889,905 | 12/1932 | Saeger | 164/14 |
| 3,181,209 | 5/1965 | Smith, Jr. | 164/95 X |
| 3,195,199 | 7/1965 | Ochs | 164/46 |
| 4,128,121 | 12/1978 | Sigsbee | 164/46 |

FOREIGN PATENT DOCUMENTS

1465908  3/1977  United Kingdom ............. 164/131
697244  11/1979  U.S.S.R. ............. 164/45

OTHER PUBLICATIONS

Kindel, F. W. et al., "Thin Foil Fabrication," in *Review of Scientific Instruments*, vol. 50, No. 12, Dec. 1979, pp. 1550–1552.

Springer, R. W. et al., "Structure and Mechanical Properties of Al/Al$_x$O$_y$ Vacuum Deposited Laminates," in *Thin Solid Films*, vol. 54, 1978, pp. 197–205.

*Primary Examiner*—Kuang Y. Lin
*Assistant Examiner*—J. Reed Batten, Jr.
*Attorney, Agent, or Firm*—William A. Eklund; Paul D. Gaetjens; Michael F. Esposito

[57] ABSTRACT

In a method of forming a thin (<2 μm) unbacked metal foil having a desired curviplanar shape, a soluble polymeric film, preferably comprising polyvinyl alcohol, is formed on a supporting structure having a shape that defines the desired shape of the foil product. A layer of metal foil is deposited onto one side of the soluble film, preferably by vacuum vapor deposition. The metallized film is then immersed in a suitable solvent to dissolve the film and thereby leave the metal foil as an unbacked metal foil element mounted on the supporting structure. Aluminum foils less than 0.2 μm (2,000 Å) thick and having an areal density of less than 54 μg/cm² have been obtained.

2 Claims, 3 Drawing Figures

METHOD OF FORMING A THIN UNBACKED METAL FOIL

BACKGROUND OF THE INVENTION

The present invention relates generally to metal foils and methods of making the same. More particularly, this invention pertains to the fabrication of very thin, unbacked metal foils. This invention is the result of a contract with the Department of Energy (Contract No. W-7405-ENG-36).

Thin metal foils are of use in various well known applications, for example, as elements of electrical devices, and as windows, filters, and targets for radiation and atomic particle beams. Additionally, thin foils are of current research interest as plasma generators. In the latter application, a large electrical charge is discharged through a foil to vaporize it and produce a plasma. Shaped foils, i.e. foils which have a curviplanar configuration, are of particular interest in this application because the plasma momentarily assumes the shape of the preexisting foil. For example, tubular foils have been of particular interest because they are useful in studies of magnetic implosion of plasmas. For various reasons, it is desirable that such foils be free of seams or creases, and be as thin as can possibly be made.

Most metal foils are manufactured by a mechanical process involving extrusion and pressing of metal sheets. The lower thickness limit obtainable with such a process is on the order of 25 $\mu$m, which is too thick for the applications referred to above.

Where thinner metal foils are required, a vacuum vapor deposition process is ordinarily employed. In such a process a metal is vaporized and subsequently condensed onto a solid substrate to form a thin foil on the substrate. In one previously known variation of this method, a metal is vaporized and deposited onto a glass plate which is coated with a water-soluble mold release agent such as cesium iodide. When the metallized plate is subsequently immersed in a water bath, dissolution of the underlying mold release agent causes the foil to separate from the glass and to become freely suspended in the water. Foils as thin as 0.07 $\mu$m have reportedly been made by this process. The foil thus made is very delicate and easily torn, and can ordinarily be handled only while still suspended in the water bath. Even with such careful handling, however, such foils can usually be successfully transferred only to a flat, substantially solid surface. It is most difficult and usually impossible to drape or stretch such a foil over an open framework or lattice-type structure so as to obtain an unbacked foil sheet which is of substantial size and which is free of surface defects. For the same reason, it has not been possible to form shaped foils by this method, as for example by wrapping the foil around a cylindrical lattice to form a foil tube.

It has also been previously known to form thin backed metal foils by vacuum vapor deposition of a metal onto a plastic film. Such a procedure is disclosed, for example, by F.W. Kindel et al., in "Thin Foil Fabrication," Review of Scientific Instruments, 50, 1550 (1979). The advantage of this variation of the vapor deposition process is that the resulting foil/plastic laminate is relatively sturdy and can be handled as required. It has not been previously possible, however, to separate the foil produced by such a procedure from the underlying plastic film. Accordingly, the film remains with the foil as an integral backing element in whatever application the foil is employed. In some applications, however, the plastic film backing is unnecessary and even undesirable because it is electrically nonconductive, and because the foil/plastic laminate is substantially thicker and heavier than the foil sheet alone.

Accordingly, it is an object and purpose of the present invention to provide a method of making a thin, unbacked metal foil.

It is also an object of the invention to provide a method of making a shaped metal foil sheet having a desired three-dimensional configuration, and which is free of seams, creases, and other discontinuities. In this regard, it is a particular object of the invention to provide a method of making a thin-walled, seamless foil tube.

It is another object of the invention to provide a method of making a thin, shaped metal foil of substantially uniform thickness.

Additional objects, advantages, and novel features of the invention will be set forth in part in the description which follows, and in part will become apparent to those skilled in the art upon examination of the following, or may be learned by practice of the invention. The objects and advantages of the invention may be realized and attained by means of the instrumentalities and combinations particularly pointed out in the appended claims.

SUMMARY OF THE INVENTOIN

To achieve the foregoing and other objects, and in accordance with the purposes of the present invention, as embodied and broadly described herein, a thin unbacked metal foil may be formed by a process comprising the steps of depositing a layer of metal onto one side of a soluble substrate film so as to form a layer of metal foil thereon, and subsequently dissolving the film in a suitable solvent so as to leave the deposited layer of metal as an unbacked foil sheet.

The primary advantage of this method over prior art methods is that prior to metallization the substrate film may be draped or stretched over, or formed directly on, a structure having a desired shape, such that the subsequently formed foil assumes the same spatial configuraiton as the substrate film. Thus, thin unbacked foil elements can be formed in various shapes limited only by the ingenuity with which the substrate film can be formed. For example, it is possible to make a cylindrical foil tube which is thin-walled, unbacked and seamless. There has not been previously known any method for making such a foil element.

The layer of metal foil is preferably formed on the substrate film by vacuum vapor deposition. In accordance with another aspect of the applicants' invention, a pulsed gas vapor deposition process is employed, wherein oxygen is periodically introduced at low pressure during the deposition process. This results in a metal foil which consists of alternating layers of the pure metal and partially oxidized metal, and which has greater tensile strength than a pure metal foil.

In accordance with a preferred embodiment of the method, the soluble film is formed of partially hydrolyzed polyvinyl alcohol. Applicants have found that polyvinyl alcohol is particularly useful in the practice of the invention because it does not undergo polymeric crosslinking under the high temperature and radiation conditions present during deposition of the metal foil layer, and thus remains soluble and may be readily dissolved in aqueous solution. Another suitable substrate film material is flexible collodion, which may be dissolved in acetone. Other suitable film materials and solvents will be apparent to those of ordinary skill in the art.

These and other aspects of the applicants' invention will become apparent to one of ordinary skill in the art upon reading the following detailed description of a preferred embodiment.

BRIEF DESCRIPTION OF THE DRAWINGS

The accompanying drawings, which are incorporated in and form a part of the specifications, illustrate selected stages in the fabrication of an exemplary foil tube by the preferred embodiment of the method of the invention. Accordingly, the drawings, when taken with the following detailed description, illustrate the practice and principles of the invention. In the drawings.

DETAILED DESCRIPTION OF THE PREFERRED EMBODIMENT OF THE INVENTOIN

Figure 1:
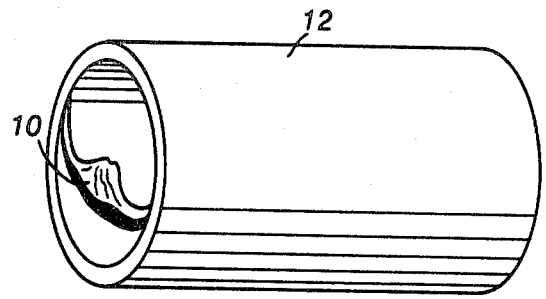
FIG. 1 is an isometric pictorial view of a dry, water-soluble polyvinyl alcohol film partially removed from the inside surface of a tubular mold.

In accordance with a preferred embodiment of the method, a soluble polymeric substrate film is formed, either as an unsupported sheet or supported on a suitable supporting structure selected to define the shape of the desired foil product. Applicants have found that polyvinyl alcohol forms a particularly suitable film for the practice of the invention, since it is readily water-soluble and also because it does not undergo polymeric cross-linking upon exposure to the heat and radiation produced during the metal vapor deposition process described further below. However, other suitable polymers are also suitable for the practice of the invention, including, for example, water-soluble cellulose ethers such as carboxy methyl cellulose and hydroxy propyl cellulose. Examples of non-water-soluble films which may be used to practice the invention include collodion, cellulose acetate, ethyl cellulose and cellulose triacetate. Any organic solvent which doe not significantly attack the foil can be used to dissolve these film materials.

Polyvinyl alcohol is ordinarily prepared by hydrolysis of polyvinyl acetate. The extent of hydrolysis of the polyvinyl acetate determines the solubility of the resulting polyvinyl alcohol in water. In practice, it is found that completely hydrolyzed polyvinyl acetate (substantially pure polyvinyl alcohol) is readily soluble only in boiling water. Adequate solubility in water for the purpose of practicing the invention at room temperature is obtained with polyvinyl acetate that is from approximately 85 to 95 percent hydrolyzed. Optimum solubility at room temperature is obtained with polyvinyl acetate that is approximately 88 percent hydrolyzed, i.e., a polyvinyl polymer consisting of 88 percent polyvinyl alcohol and 12 percent polyvinyl acetate. Such a polymer is commercially available, for example, from Aldrich Chemical Company of Milwaukee, Wisconsin, and is the preferred material for the practice of the invention.

The polyvinyl alcohol film is preferably formed on a mold and subsequently transferred to a suitable supporting structure. The film is formed by coating the mold with a mold-release agent and briefly immersing it in an aqueous solution of polyvinyl alcohol, then removing the mold and allowing it to dry to form a thin film of polyvinyl alcohol on the surface of the mold. It is found that preparation of a suitable film on a smooth mold surface requires a solution of polyvinyl alcohol having a viscosity between approximately 200 and 10,000 centipoises, with the preferred range being from approximately 1000 to 3000 centipoises. These ranges correspond to aqueous solutions having from 6 to 15% and from 8 to 12% by weight polyvinyl alcohol, respectively.

A plasticizer may be included in the polyvinyl alcohol film to render it more flexible during handling, and also to enable the film to be subsequently tightened prior to metallization. With regard to the latter, the plasticizer should preferably be one which is soluble in aqueous solution with the polyvinyl alcohol, and which is also soluble in other solvents in which the polyvinyl alcohol is not soluble. Such a plasticizer can be selectively leached from the film, after the film has been finally emplaced, by soaking the film in a solvent which dissolves the plasticizer without attacking the film. A suitable plasticizer for this purpose is glycerin. The plasticizer may be present in any concentration up to that which renders the film tacky (approximately 35% by weight in the case of glycerin).

The dried film formed on the mold surface is manually removed and transferred to a suitable supporting structure that will ultimately define the shape of the final foil product. In this regard, it is found that a polyvinyl alcohol film formed as described above is sufficiently strong and flexible to be manually handled while dry. FIG. 1 shows a dry film 10 being removed from the inside surface of a mold consisting of a stainless steel tube 12.

Figure 2:
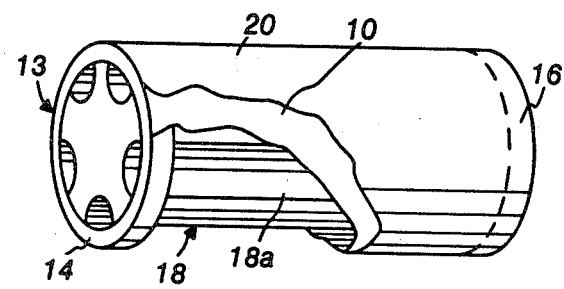
FIG. 2 illustrates the tubular film of FIG. 1 after it has been stretched over a support structure that consists of a pair of spaced rings affixed to a fluted axial core, and after deposition of a layer of aluminum foil on the outer surface of the film, with portions of the foil and film removed for purpose of illustration.
Figure 3:
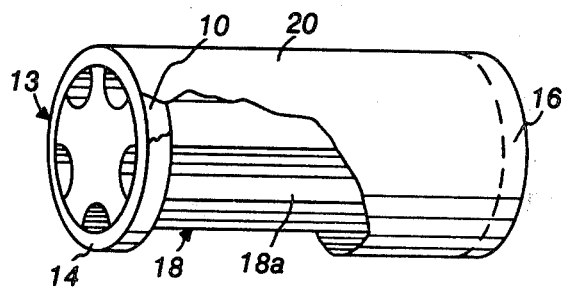
FIG. 3 illustrates the aluminum foil tube remaining on the support structure after the underlying film has been dissolved in a suitable solvent, with a portion of the foil removed to show the undissolved portions of the film that remain between the foil and the supporting rings.

The supporting structure to which the dry film is transferred should be in the form of a lattice, framework or similar structure which has a minimum surface area in contact with the film. This enables maximum exposure of the film to the solvent in the subsequent dissolution step. For example, where it is sought to form a foil tube, a tubular film 10 such as that shown in FIG. 1 may be transferred to a supporting structure 13 as shown in FIGS. 2 and 3, which comprises a pair of spaced rings 14 and 16 affixed to an axial core 18. The rings 14 and 16 have a diameter slightly less than that of the tubular mold 12, such that the tubular film 10 may be slipped over the rings 14 and 16 and loosely emplaced to span the gap between the spaced rings. The axial core 18 includes longitudinal flutes 18a which allow a solvent to flow freely through the rings 14 and 16, as discussed further below.

When first transferred to the supporting structure, the dry film fits loosely and must be tightened before metallizing. In some cases, the application of heat alone is sufficient to shrink the film. Preferably, however, the supporting structure and the film are immersed in a suitable solvent to selectively dissolve the plasticizer and thereby shrink the film and render it tautly stretched over the supporting structure. Where the plasticizer is glycerin, as noted above, suitable solvents include acetone and isopropyl alcohol, which selectively leach and dissolve the glycerin plasticizer without dissolving the polyvinyl alchol film.

After dissolution of the plasticizer, the supporting structure and film are removed as a unit from the solvent. At this point the film may be manually adjusted while still wet to remove large wrinkles or creases. The film is then air dried, preferably in a convection oven at 80° C. As the solvent evaporates, the film shrinks tightly around the supporting structure to produce a smooth, taut surface that is suitable for metallizing.

A layer of metal foil is then formed on the outside of the dried film, preferably by vacuum vapor deposition. This is a well-known process which involves placing the film and supporting structure in a vacuum chamber and condensing a vaporized metal onto the film. A pulsed gas process may preferably be employed in this step to improve the tensile strength of the resulting foil. During such a process, small amounts of oxygen are periodically introduced into the vacuum chamber during the metal deposition process in order to produce a foil layer consisting of alternating layers of the pure metal and partially oxidized metal species. A complete description of such a pulsed gas vapor deposition process as applied to the formation of an aluminum foil on a plastic film is set forth by R. W. Springer et al., in "Structure and Mechanical Properties of $Al/Al_xO_y$ Vacuum Deposited Laminates," Thin Solid Films, 54, 197 (1978). FIG. 2 shows a layer of metal foil 20 as it is deposited on the outer surface of the substrate film 10.

In the final stage of the fabrication process, the substrate film is removed by immersing the supporting structure, together with the metallized film, in a water bath. Those portions of the polyvinyl alcohol film exposed to water are substantially dissolved within a few seconds, and dissolution is complete within a few minutes. At points where the film is adhered to the supporting structure, and thus sandwiched between the supporting structure and the foil, complete dissolution does not occur. At such points the film remains and acts as an adhesive to secure the foil to the supporting structure. FIG. 3 illustrates the aluminum foil tube obtained after the structure of FIG. 2 has been immersed in solution and the film 10 dissolved. It will be seen that only those portions of the film 10 in contact with the rings 14 and 16 remain after immersion in the water bath.

After dissolution of the film is complete, the supporting structure and the unbacked metal foil mounted thereon must be removed from the water bath. This step must be conducted carefully to avoid tearing the metal foil. Disturbances of the water must be avoided. In practice, it is found preferable to slowly drain the water from the bottom of the bath while holding the supporting structure and foil stationary.

In actual tests of the method described above, shaped aluminum foils ranging in thickness from 0.17 $\mu$m (1700 Å) to 1.5 $\mu$m (15,000 Å) have been produced. Such foils have been produced in tubular configurations up to 14 centimeters in diameter. The following descriptions of two demonstrative tests more clearly illustrate the practice of the method.

EXAMPLE 1

In an exemplary demonstration of the method described above, a suitable mold comprised a stainless steel tube having an inside diameter of approximately 3" and a highly polished inside surface. The inside surface of the tube was sprayed with a mold-release agent and briefly immersed in a solution consisting of 9.8% by weight polyvinyl alcohol (88% hydrolyzed), 2.4% glycerin, and 87.8% water. The tube was removed from the solution, excess solution was allowed to drain, and the wetted tube was dried for 1.5 hours at 80° C. in a convection oven. The resulting film formed on the inside surface of the tube was then manually removed. The film was found to be sufficiently strong and flexible to permit handling as long as it was kept dry. The tubular film was then slipped over a supporting structure similar to that shown in FIGS. 2 and 3, consisting of two steel rings having outside diameters a few thousandths of an inch less than the inside diameter of the mold. The spaced rings of the supporting structure were fixed to a fluted cylindrical core.

The dry tubular film was loosely stretched over the supporting structure to remove major wrinkles and creases. The supporting structure and film were then immersed in acetone and subsequently removed and dried in a convection oven at 80° C. The film shrunk tightly around the retaining rings upon evaporation of the acetone to form a smooth, taut cylindrical film substrate.

The supporting structure and film were then subjected to vacuum vapor deposition of aluminum, utilizing the pulsed oxygen process referred to above, with a single pulse of oxygen being introduced at a pressure of $10^{-6}$ to $10^{-4}$ torr approximately half-way through the deposition. The aluminium was deposited at a rate of approximatly 4,000 Å per minute for approximately 30 seconds. The supporting structure and film were continuously rotated during deposition of the aluminum so as to obtain a foil layer of uniform thickness. A foil layer approximately 0.2 $\mu$m (2,000 Å) thick was formed on the outer surface of the film.

The aluminized film and supporting structure were then slowly lowered into a water bath at room temperature. Dissolution of the film was complete within a few minutes, except for those areas in contact with the rings, where the film remained as an adhesive securing the foil to the supporting rings. The water bath was carefully drained so as not to disturb the aluminum foil. The resulting aluminum foil tube was found to have an areal density of approximately 54 $\mu$g/cm$^2$, and had a mirror-like finish substantially free of wrinkles, creases, and other surface defects.

EXAMPLE 2

A tubular stainless steel ring having an inside diameter of 4 cm and an axial length of 2 cm was selected as a mold. The inside surface of the ring was polished and coated with a mold release agent.

A flexible collodion solution was employed to form the substrate film. Such a solution is commercially available from J. T. Baker Chemical Company of Phillipsburg, N.J., and consists of approximately 40 g of flexible collodion (nitrated cellulose) dissolved in 100 g of a mixture consisting of 3 parts by volume diethyl ether and 1 part by volume ethanol, and further including 2% camphor and 3% castor oil as plasticizers. The ring was dipped in this solution four times at fifteen second intervals and subsequently air dried. The resulting dry collodion film was manually peeled from the inside of the ring and transferred to a supporting structure having two spaced retaining rings each 4 cm in diameter. The film was then coated with aluminum using the pulsed gas process described above. An aluminum layer 1.5 μm thick was formed in this manner. The assembly was then dipped in acetone, which quickly dissolved the collodion film to leave behind an unbacked, seamless aluminum foil tube on the retaining rings.

The foregoing descriptions of exemplary embodiments of the invention have been presented for purposes of illustration and description. They are not intended to be exhaustive or to limit the method of the invention to the precise forms disclosed; and various modifications, substitutions, and alterations may be made in light of the above teaching without departing from the spirit of the invention. In particular, various combinations of film-forming materials and suitable solvents for dissolving them will be apparent to a chemist of ordinary skill. The embodiments described above were selected and described in order to set forth the best mode known to the applicants and to best explain the principles of the invention and its practical application, to thereby enable others skilled in the art to best utilize the invention in various embodiments and with various modifications as are suited to the particular use contemplated. Accordingly, it is intended that the scope of the invention be defined by the claims appended hereto.

What is claimed is:

1. A method of forming a thin unbacked metal foil, comprising the steps of:
    (a) forming on a suitable mold a film comprising polyvinyl alcohol and a plasticizer;
    (b) transferring said film to a supporting structure;
    (c) shrinking said film about said supporting structure by immersing said supporting structure and said film in a solvent selected to preferentially dissolve said plasticizer without dissolving said polyvinyl alcohol in said film;
    (d) depositing a continuous layer of metal at least approximately 1700 Angstroms thick onto said film by vacuum vapor deposition; and
    (e) immersing said film with said layer of metal deposited thereon in a suitable solvent to dissolve said film.

2. The method defined in claim 1 wherein said film is formed by immersing said mold in an aqueous solution comprising between 6 and 15% by weight polyvinyl alcohol, said polyvinyl alcohol being from 85 to 95% hydrolyzed, and subsequently removing said mold from said solution and allowing it to dry.

* * * * *